United States Patent [19]
Raiteri

[11] Patent Number: 6,098,274
[45] Date of Patent: Aug. 8, 2000

[54] MACHINE TOOL FEATURING A NUMBER OF MACHINING HEADS FOR MACHINING PRINTED CIRCUIT BOARDS

[75] Inventor: Angelo Raiteri, Ivrea, Italy

[73] Assignee: Pluritec Italia S.p.A., Borgomanero, Italy

[21] Appl. No.: 09/163,069

[22] Filed: Sep. 29, 1998

[30] Foreign Application Priority Data

Oct. 2, 1997 [IT] Italy .................................. TO97A0869

[51] Int. Cl.[7] .................................................. B23P 19/00
[52] U.S. Cl. .............................. 29/739; 29/743; 29/740; 483/13; 483/55
[58] Field of Search .................................. 29/739, 26 A, 29/740, 741, 743, 786, 742; 483/55, 43, 54, 58; 408/95

[56] References Cited

U.S. PATENT DOCUMENTS

| | | | |
|---|---|---|---|
| 1,060,705 | 5/1913 | Potter | 29/26 A |
| 3,583,054 | 6/1971 | Hughes | 29/203 |
| 4,596,067 | 6/1986 | Raiteri | 29/568 |
| 4,715,108 | 12/1987 | Sugiyama et al. | 29/568 |
| 4,730,373 | 3/1988 | Senoh | 29/26 |
| 4,765,784 | 8/1988 | Karwan | 408/13 |
| 4,786,216 | 11/1988 | Kitagawa et al. | 408/69 |
| 4,865,494 | 9/1989 | Gudow | 408/13 |
| 4,982,831 | 1/1991 | Irie et al. | 198/617 |
| 5,002,448 | 3/1991 | Kamijima | 414/225 |
| 5,075,530 | 12/1991 | Lee | 219/69.11 |
| 5,109,584 | 5/1992 | Irie et al. | |
| 5,230,685 | 7/1993 | Christen et al. | 483/55 |
| 5,855,059 | 1/1999 | Togami et al. | 29/740 |

FOREIGN PATENT DOCUMENTS

| | | |
|---|---|---|
| 25 35 973 | 2/1977 | Germany . |
| 42 88 062 | 4/1994 | Germany . |
| 2532226 | 3/1984 | Switzerland ............ 29/568 |

OTHER PUBLICATIONS

"Gridless Printed Circuit Baord Drilling Machine", IBM Technical Disclosure Bullentin, vol. 31, No. 11, Apr. 1989, pp. 242–243.

*Primary Examiner*—Jessica J. Harrison
*Assistant Examiner*—Minh Trinh
*Attorney, Agent, or Firm*—Sheridan Ross P.C.

[57] ABSTRACT

The machine tool featuring a number of machining heads for machining printed circuit boards has a worktable movable along the Y axis, and two rows of four machining heads fitted to a common carriage movable along the X axis. The circuit boards are arranged in packs, each having two locating pins for aligning and locking the pack to a respective rectangular fixture fitted to the worktable with the short side parallel to the Y axis. Each pair of heads is provided with a pair of tool-change devices and a common tool store, which is defined by one or two boxes removably insertable inside respective supports fitted to the carriage; three pairs of tool-change devices are housed inside gaps between adjacent pairs of fixtures; and a further two pairs of tool-change devices are located adjacent to the end fixtures.

15 Claims, 6 Drawing Sheets

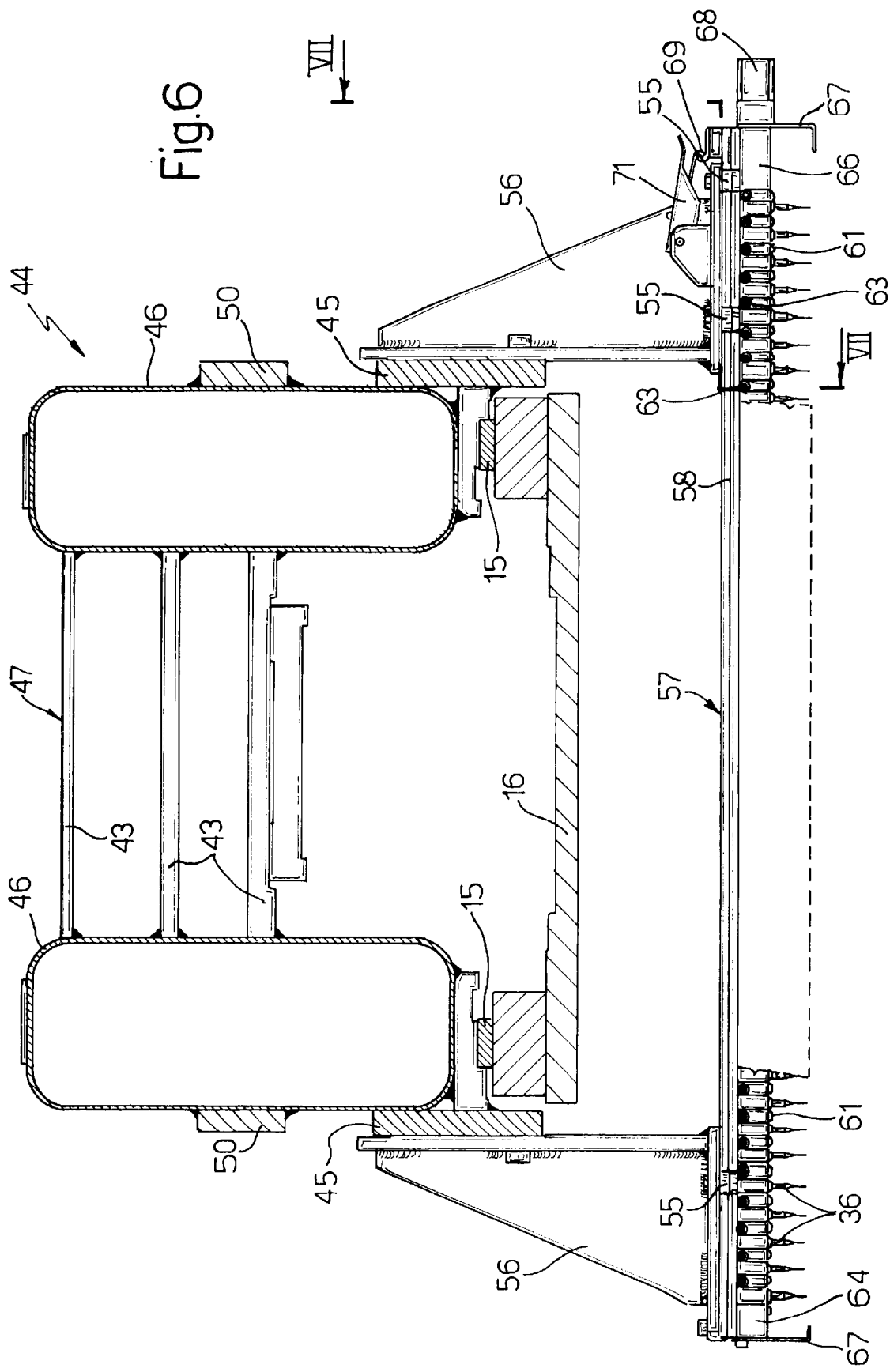

MACHINE TOOL FEATURING A NUMBER OF MACHINING HEADS FOR MACHINING PRINTED CIRCUIT BOARDS

BACKGROUND OF THE INVENTION

The present invention relates to a machine tool featuring a number of machining heads for machining printed circuit boards.

To meet the increasing demand for printed circuit boards in the manufacture of various types of electronic equipment, machine tools have been devised featuring a number of machining heads operating in parallel on respective packs of boards. As is known printed circuit boards are normally rectangular, often of standard size with a long and a short side, and are arranged in packs with locating pins.

Various types of multiple-head machine tools are known, in which the packs of boards are set up on a table movable in a first direction or along a first axis, the heads are movable on a crosspiece along a second axis, and the packs are arranged with the short side parallel to the traveling direction of the heads. Machines of this sort present the drawback of being excessively wide when equipped with more than four heads.

For example, one known machine for machining maximum 570×720 mm packs has been equipped with six heads, which means a crosspiece of at least 4000 mm and a total width of about 5000 mm. As these dimensions also involve appropriate sizing of the support, guide and drive members, six heads are considered the absolute limit, and invariably result in a machine of enormous weight, high production cost and poor machining precision.

U.S. Pat. No. 5,230,685 relates to a printed circuit board machine tool featuring two rows of machining heads supported on two parallel crosspieces. For boards of the above maximum size, however, the corresponding worktable must travel about 1500 mm, thus making the machine excessively wide. Moreover, as the packs machined by the second row of heads are practically impossible to load manually from the front of the machine, the table must also be accessible from the rear, thus requiring considerable extra floor space.

SUMMARY OF THE INVENTION

It is an object of the present invention to provide a highly straightforward, reliable machine tool for machining printed circuit boards, designed to overcome the aforementioned drawbacks typically associated with known machines.

According to the present invention, there is provided a machine tool featuring a number of machining heads for machining printed circuit boards, and which comprises a worktable movable in a first direction, and two rows of machining heads movable in a second direction perpendicular to said first direction; said boards being rectangular with a short side and a long side; and the machine being characterized in that said boards are arranged on said worktable with the short side parallel to said first direction.

According to a further aspect of the invention, each pair of heads is provided with a pair of tool-change devices and a common tool store; said store being fitted to a carriage, and being accessible from the front side of the machine.

BRIEF DESCRIPTION OF THE DRAWINGS

A preferred, non-limiting embodiment of the present invention will be described by way of example with reference to the accompanying drawings, in which:

FIG. 6 shows a larger-scale, partially sectioned side view of the FIG. 1 machine;

DETAILED DESCRIPTION OF THE INVENTION

Figure 1:
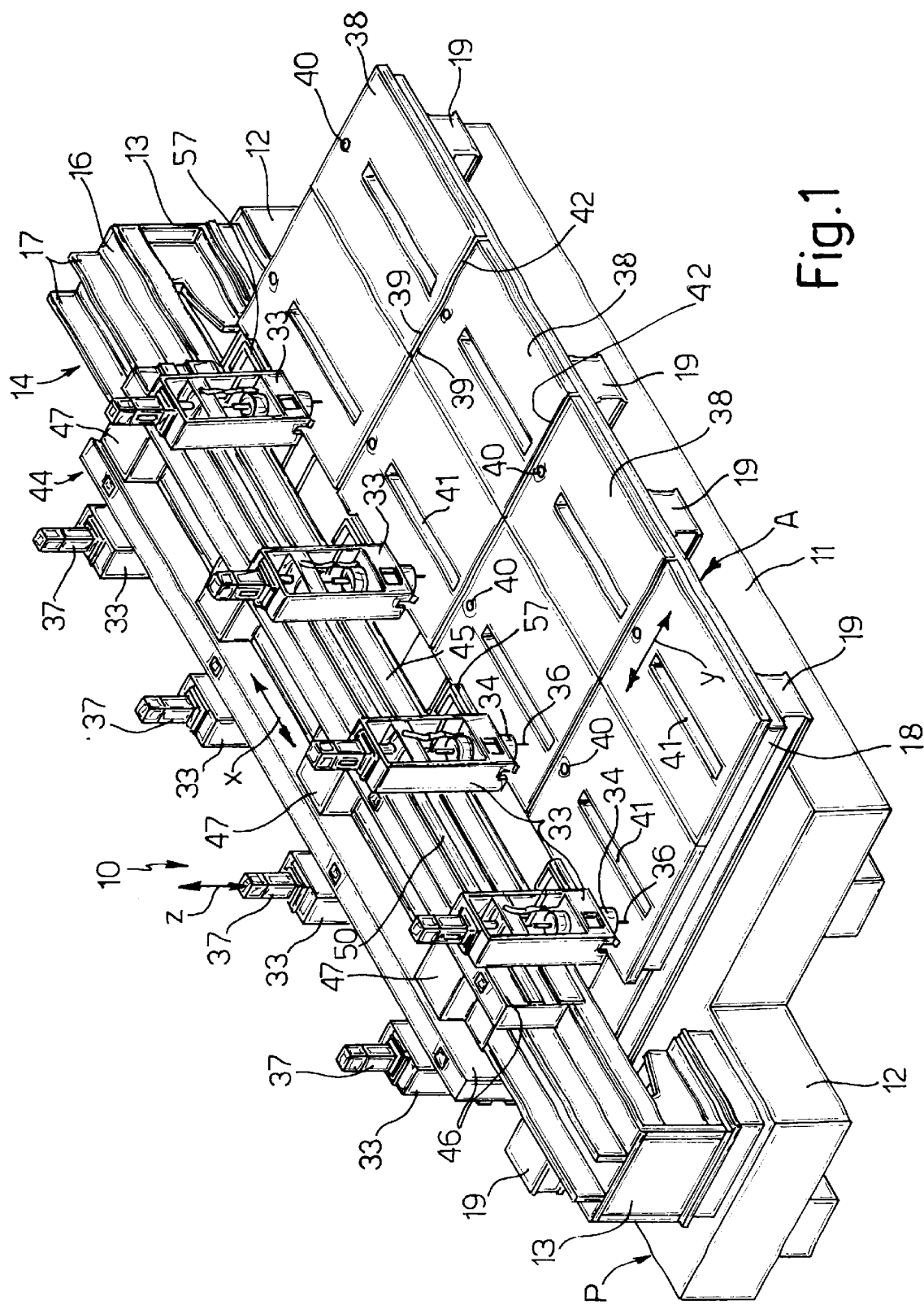
FIG. 1 shows a partial view in perspective of a machine tool for machining printed circuit boards according to the present invention.
Figure 2:
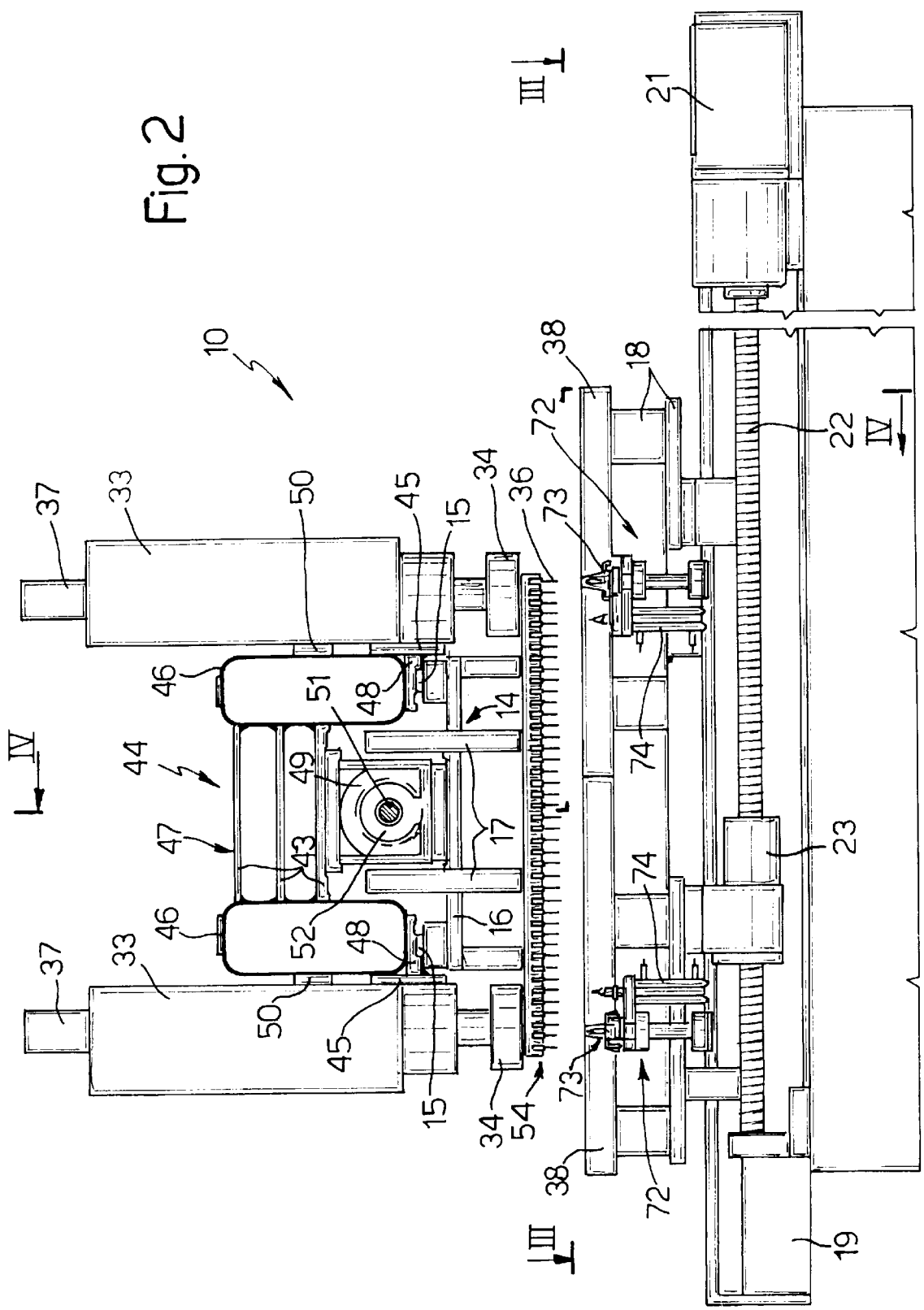
FIG. 2 shows a side view of the FIG. 1 machine.
Figure 5:
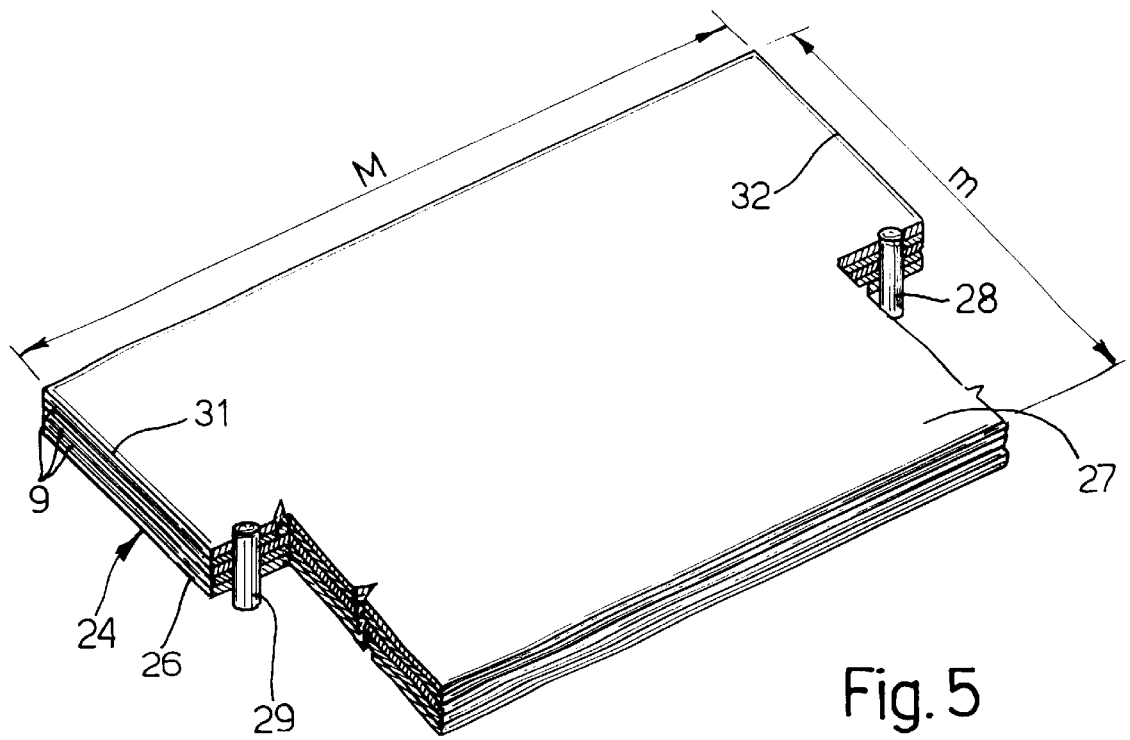
FIG. 5 shows a larger-scale, partially sectioned view in perspective of a pack of printed circuit board.

With reference to FIGS. 1 and 2, number 10 indicates as a whole a machine tool for machining printed circuit boards 9 (FIG. 5), and which comprises a base 11 made, for example, of steel and in turn comprising two lateral appendixes 12 adjacent to the rear side P of machine 10. Appendixes 12 are fitted with two lateral uprights 13 in turn fitted with a steel crosspiece 14 comprising a strong horizontal plate 16 supporting two prismatic guides 15, and two strong vertical plates 17.

Machine 10 also comprises a worktable 18 movable in a first direction hereinafter indicated as axis Y. More specifically, table 18 is guided by four longitudinal guides 19 fitted to base 11, and is moved along axis Y by a numerically controlled reversible electric motor 21 (FIG. 2) via a screw 22 engaging a nut screw 23 fitted to table 18.

As is known, printed circuit boards 9 (FIG. 5) are normally rectangular with a short side or smaller dimension m and a long side or larger dimension M, and are machined—mainly drilled but also possibly milled—in packs 24, each comprising a number of boards 9, e.g. three, for machining simultaneously.

More specifically, boards 9 in each pack 24 are packed between an auxiliary bottom plate 26 and an auxiliary cover plate 27, and are connected, i.e. pinned, to one another by a pair of pins 28 and 29 located along the center line of pack 24, at two edges 31 and 32 parallel to short side m, and which project from auxiliary bottom plate 26 to define two locating pins by which to position the pack on table 18.

According to the present invention, boards 9 are positioned on table 18 (FIGS. 1 and 2) with short side m parallel to axis Y. More specifically, machine 10 comprises two rows of machining heads 33, each row comprising four heads 33; table 18 is designed to receive two corresponding rows of four packs 24; and each machining head 33, in itself known, comprises a vertical tool spindle 34 for receiving a tool 36, and which is moved along a vertical axis Z by a numerically controlled reversible electric motor 37.

Figure 3:
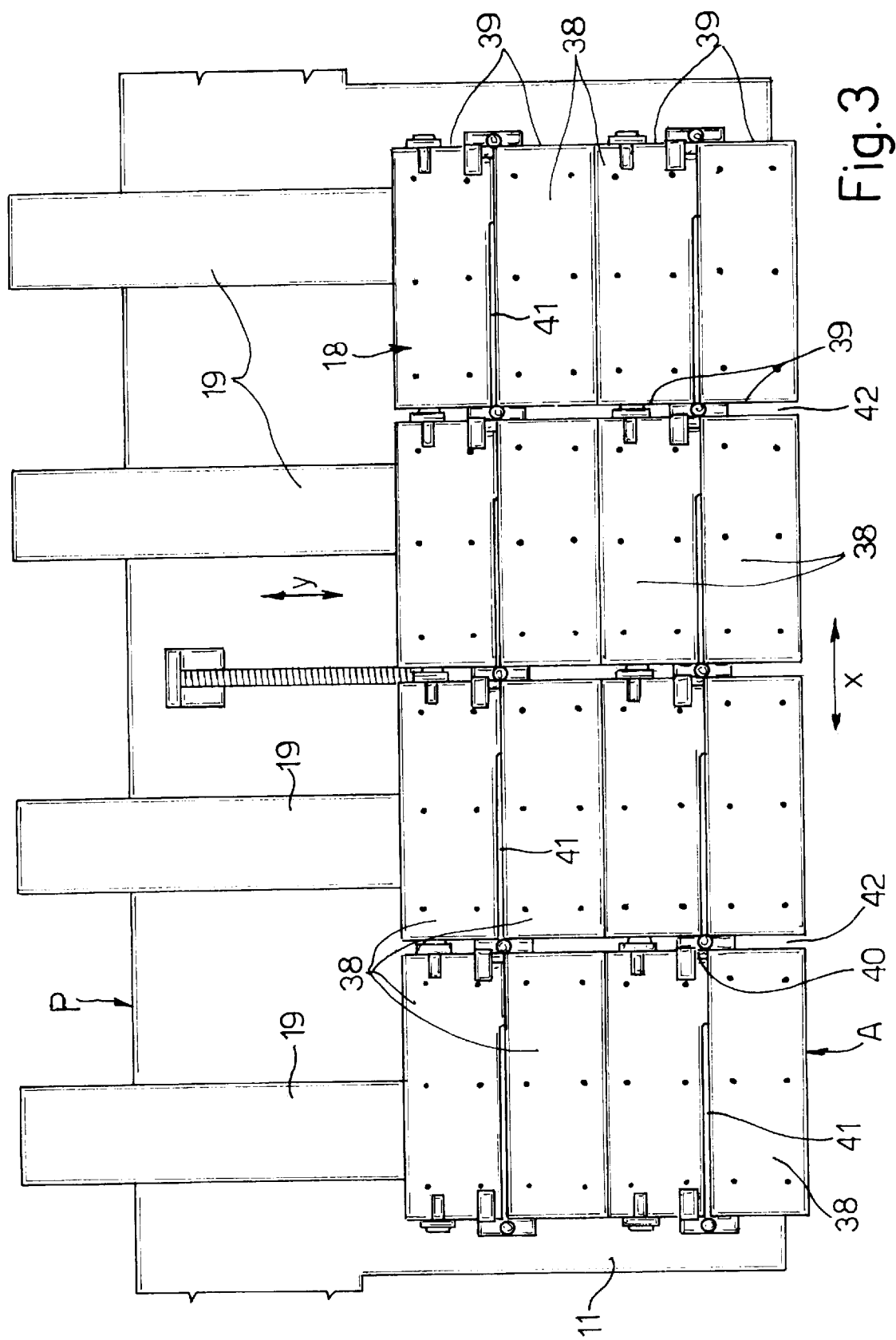
FIG. 3 shows a section along line III—III in FIG. 2 and in a different operating position.

Table 18 comprises two rows of known fixtures 38, each for aligning and locking a respective pack 24 for machining. More specifically, each fixture 38 (FIG. 3) comprises a rectangular plate with two short sides 39, and which is positioned with short sides 39 parallel to axis Y, and is screwed to table 18; a V-shaped seat 40 for receiving, for example, locating pin 28 of pack 24; and a groove 41 for receiving the other locating pin 29 of pack 24. As groove 41 receives pin 29 regardless of the distance between pins 29 and 28, each fixture 38 may therefore receive packs 24 differing in size within certain limits.

Figure 4:
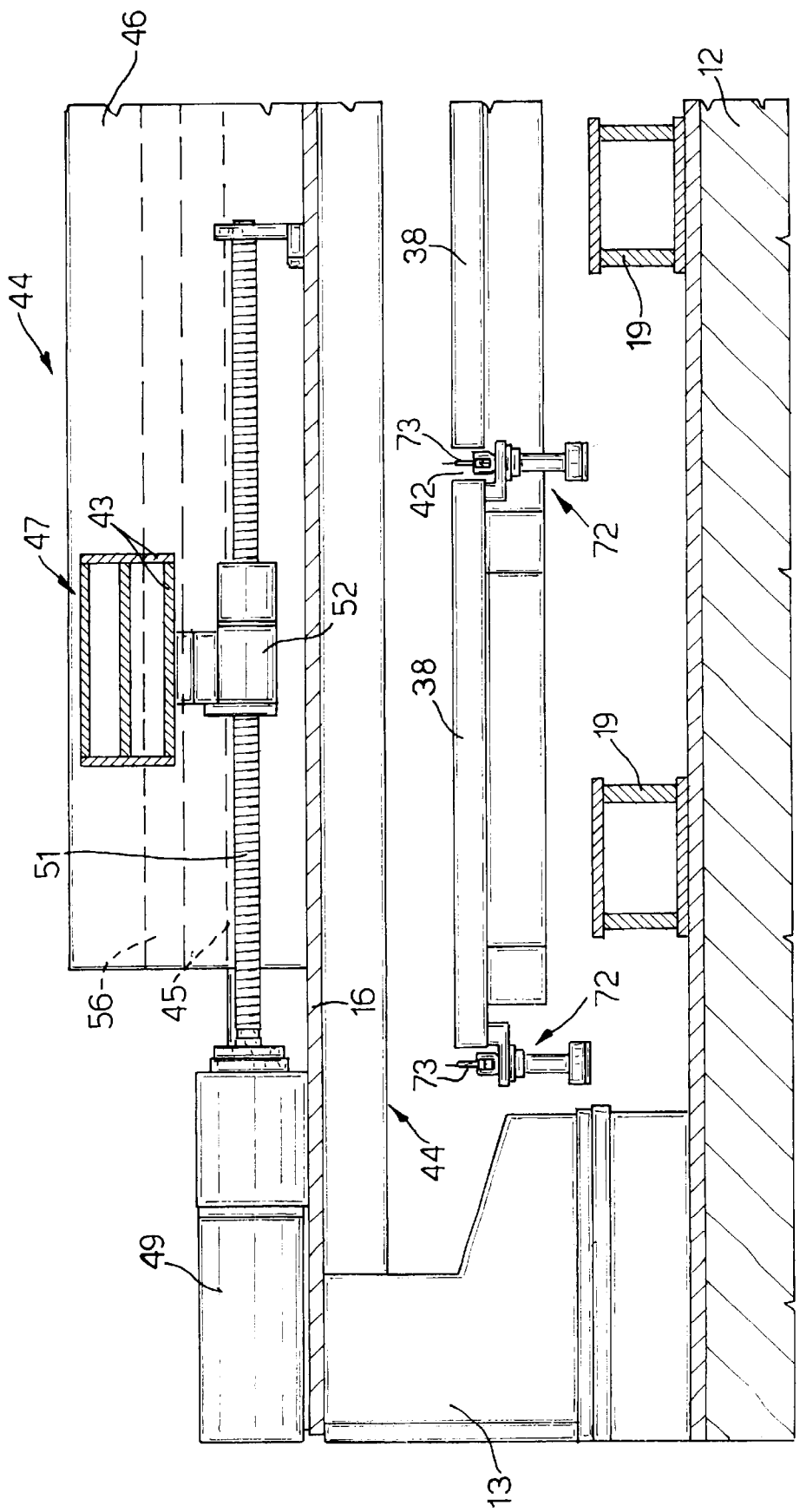
FIG. 4 shows a partial section along line IV—IV in FIG. 2.

The grooves 41 of fixtures 38 in each row are aligned along the X axis; the corresponding fixtures 38 in the two rows are so located as to minimize the distance between respective grooves 41; and the corresponding fixtures 38 in the two rows define pairs of fixtures 38, which are so spaced along the X axis as to leave gaps 42 between adjacent sides 39 (FIG. 4).

The corresponding machining heads 33 in the two rows (FIG. 1) define pairs of heads 33, and are aligned along the Y axis; heads 33 in the two rows are so located that the distance between the axes of the two spindles 34 (FIGS. 1 and 3) of each pair of heads 33 equals the distance between the axes of each pair of grooves 41; and heads 33 in each row are so located that the distance, along the X axis, between the axes of respective spindles 34 (FIGS. 1 and 3) equals the distance between seats 40 of adjacent fixtures 38 in each row.

Heads 33 are guided along the X axis by crosspiece 14. More specifically, heads 33 are supported on a common carriage 44 defined by two parallel bars 46 connected by a number of cross members 47; bars 46 are made of steel box section; and cross members 47 (FIG. 2) comprise three horizontal plates 43 connected by transverse plates.

Each box section bar 46 is reinforced by two prismatic bars 45 and 50 parallel to the X axis. More specifically, bars 45 and 50 are rectangular in section, and provide for securing heads 33 to carriage 44; each bar 45 comprises a number of shoes 48, each engaging two faces of the corresponding prismatic guide 15; and plate 16 supports a numerically controlled reversible electric motor 49 (FIG. 4) for moving carriage 44 along axis X via a screw 51 engaging a nut screw 52 fitted to a plate 43 of one of cross members 47 of carriage 44.

To machine packs 24 of maximum 720×570 mm size on a machine tool constructed according to the present invention, the work travel of carriage 44 along axis X (FIG. 1) is 720 mm; the work travel of table 18 along axis Y is barely 570 mm; table 18 may be moved forward into the FIG. 1 and 2 position to load and unload packs 24 from the front A of machine 10; and the total length of the machine may advantageously be kept within roughly 4000 mm, with a width of less than 2350 mm.

To load and unload packs 24 manually on and off fixtures 38, table 18 is moved forward into the FIG. 1 position allowing easy access by the operator not only to fixtures 38 in the front row, but also those in the rear row, the mid portion of which is roughly 800 mm from the front edge of table 18.

The holes drilled into boards 9 are normally laid out, as is known, in rows and columns; and, on machine tool 10, the columns of hole locations are arranged parallel to the X axis. To operate machine 10, table 18 is first moved from the FIG. 1 loading and unloading position to a work position in which, for example, the first column of hole locations of packs 24 in the rear row corresponds with tools 36 of machining heads 33 in the rear row, and the first column of hole locations of packs 24 in the front row corresponds with tools 36 of machining heads 33 in the front row.

Carriage 44 is then moved to set the eight machining heads 33 over the corresponding hole locations of the eight packs 24, the eight heads 33 are operated either simultaneously or selectively, and so on for each hole location in each column. To move from one column of hole locations to another, table 18 is moved each time along axis Y; and, once all the holes are drilled, table 18 is restored to the loading and unloading position shown in FIG. 1.

Figure 7:
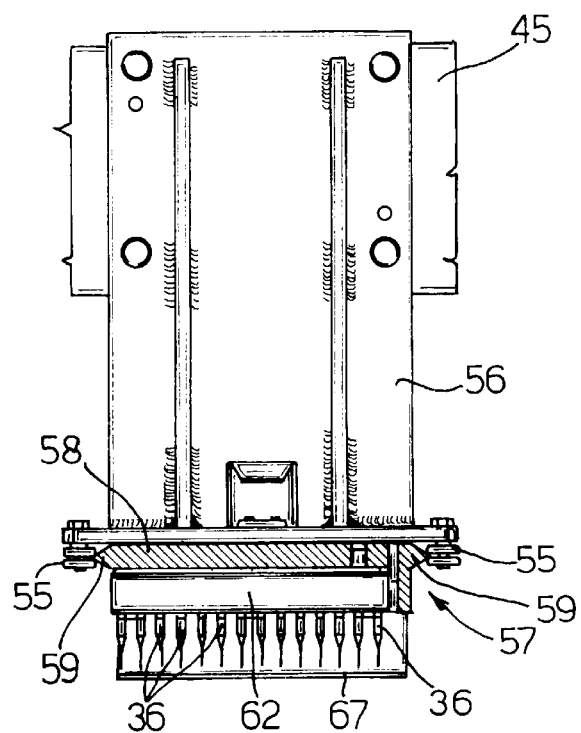
FIG. 7 shows a partial section along line VII—VII in FIG. 6.

According to a further aspect of the invention, the machining heads 33 in each pair (FIG. 2) are provided with a common store 54 for tools 36, which is fitted to a support in turn fitted to rectangular-section bars 45 of carriage 44 (FIGS. 6 and 7). More specifically, for each pair of heads 33, rectangular-section bars 45 of carriage 44 are fitted with two pairs of brackets 56 (not shown in FIG. 1 for the sake of simplicity) located respectively to the right and left of heads 33; each bracket 56 comprises pairs of V-section guide rollers 55; and the rollers 55 of two corresponding brackets of the two bars 45 may be fitted removably in between with a respective box 57 containing a number of tools 36 arranged in rows and columns.

More specifically, each box 57 comprises an inverted-L-section body 58 (FIG. 7) in turn comprising two wedge-shaped edges 59 engaging rollers 55; body 58 comprises a number of separating elements 61 defining a number of prismatic guides; and each prismatic guide is insertable with a clip comprising a plastic strip 62 supporting a row of fourteen, e.g. collarless, tools 36.

In section, each strip 62 comprises an asymmetric cavity engaging a washer 63 (FIG. 6) at the front (on the left in FIG. 7) of element 61 to ensure foolproof insertion of strip 62, i.e. with a predetermined orientation; and the two ends of body 58 (FIG. 6) are provided with respective strengtheners 64, 66, each comprising a guard 67 for preventing the tips of tools 36 from contacting a supporting surface.

Strengthener 66 of each box 57 comprises a grip 68, and a retaining element 69 which engages a known hand-operated release lever 71; and boxes 57 are easily inserted and removed from between rollers 55 of brackets 56 by the operator stationed at the front A of machine 10.

Box 57 contains forty-two strips 62, making a total capacity of 588 tools 36. Store 54 of tools 36 of each pair of heads 33 may comprise only one box 57 of 588 tools, which may be located, for example, between the brackets to the right of heads 33, as in FIG. 1. Or, if a greater number of tools 36 is required, store 54 may comprise two boxes 57 located between two pairs of brackets 56 of each pair of heads 33, making a total capacity of store 54 of 1176 tools.

Table 18 (FIGS. 2 and 3) comprises five pairs of tool-change devices 72, each comprising a pneumatically operated gripper 73, which provides for removing tool 36 both from spindle 34 and from store 54, and which is moved along the Z axis by a corresponding pneumatic piston 74.

Three pairs of devices 72 are located in the three gaps 42 between adjacent pairs of fixtures 38; two pairs of devices 72 are located adjacent to the two outer edges 39 of the lateral pairs of fixtures 38; the devices 72 of all five pairs are arranged in two rows corresponding with the two rows of machining heads 33; and the grippers 73 of each pair of devices 72 are separated by a distance equal to that between the axes of a pair of spindles 34.

Tools 36 are changed as follows.

The tools 36 in boxes 57 fitted to brackets 56 to the right of pairs of heads 33 are changed by the three pairs of devices 72 in gaps 42 and the pair of devices 72 adjacent to the outer side 39 of lateral fixtures 38 on the right; and the tools 36 in boxes 57 fitted to brackets 56 to the left of pairs of heads 33 are changed by the three pairs of devices 72 in gaps 42 and the pair adjacent to the outer side 39 of lateral fixtures 38 on the left.

Tools 36 of all eight machining heads 33 are changed simultaneously. Firstly, table 18 is moved along the Y axis into a tool-change position in which grippers 73 are positioned in the two transverse planes containing the axes of spindles 34; and, at the same time, carriage 44 is moved along the X axis into a tool-change position in which the axes of spindles 34 correspond with respective grippers 73.

At this point, grippers 73 are raised simultaneously by pistons 74 to engage tools 36 of respective spindles 34; as grippers 73 are closed, spindles 34 are opened, and grippers 73 are lowered to withdraw the eight worn tools 36 from spindles 34; and carriage 44 is moved along the X axis to bring the rows of boxes 57 in which to deposit the worn tools 36 withdrawn from the rear row of spindles 34 into the planes containing the axes of pairs of grippers 73.

At the same time, table 18 is moved along the Y axis to align the rear row of grippers 73 with the strips 62 into which the worn tools 36 are to be deposited by grippers 73; pistons 74 of the rear row of grippers 73 are activated to insert the worn tools 36 inside the respective seats in strips 62; and carriage 44 and table 18 are again operated to insert the worn tools 36 of the front row of grippers 73 inside the respective seats.

Subsequently, carriage 44 and table 18 are again operated, a first time to withdraw, by means of the rear row of grippers 73, the new tools 36 to be inserted inside the rear row of spindles 34, and a second time to withdraw, by means of the front row of grippers 73, the new tools 36 to be inserted inside the front row of spindles 34. Finally, carriage 44 and table 18 are again operated to align the eight grippers 73 with the eight spindles 34, so that the eight new tools 36 are inserted simultaneously inside spindles 34.

The advantages, as compared with known machines, of the machine tool according to the present invention will be clear from the foregoing description. In particular, the machine is lightweight, compact and cheap to produce; the short length of crosspiece 14 provides for a high degree of machining precision; and the narrow width of the machine enables packs 24 of boards 9 as well as boxes 57 of tools 36 to be loaded and unloaded from front side A, thus reducing the amount of floor space required.

Moreover, using a common tool store 54 for each pair of machining heads 33 provides for simplifying the structure of the machine; and using two boxes 57 of tools 36 for each pair of heads 33 provides for doubling the number of tools 36 available by simply providing a pair of tool-change devices 72.

Clearly, changes may be made to the machine tool as described and illustrated herein without, however, departing from the scope of the accompanying claims. For example, the number of pairs of machining heads may differ; and each box 57 of tools 36 may be inserted in a prismatic guide as opposed to between rollers 55.

Moreover, as opposed to a box, tool store 54 may be in the form of a drum, which may be rotated selectively to select a given tool location; and the sequence of tool-change operations may be varied, so that the new tools 36 are withdrawn from store 54 by each row of devices 72 as soon as the respective worn tools 36 are inserted.

What is claimed is:

1. A combination of a number of rectangular printed circuit boards, each one of said board having a short side and a long side and a machine tool featuring a number of machining heads comprising: A plurality of machining heads in which each of the head operatively associated with one of a corresponding boards; said machine tool including a worktable adapted to support said number of boards and moveable in a first direction; said heads being arranged in two parallel rows distanced along said first direction and being moveable along a second direction perpendicular to said first direction; said boards being arranged on said worktable in two parallel rows associated with said two rows of heads so that each said board presents its short side parallel to said first direction; wherein each of said heads comprises a vertical-axis tool spindle; wherein said two rows of heads are arranged so that the axes of the respective spindles are separated by a distance equal to that between corresponding rows of boards, and said axes in each row of heads are separated by a distance equal to that between two adjacent boards in each row, wherein said boards are arranged in a pack having two locating pins at two edges parallel to said short side (m); at least said long side (M) being of variable length; said pack being aligned and locked, for machining, by means of a fixture fitted to said work table; and said fixture comprising a seat for one of said pins, and a groove for receiving the other of said pins; and wherein said worktable comprises a number of said fixtures of rectangular shape and arranged in two rows; each of said fixtures being associated with one of said heads; and said grooves of said fixtures being parallel to said second direction, so that the grooves of the fixtures in each row are aligned with one another.

2. A combination as claimed in claim 1, wherein said heads slide along a common crosspiece parallel to said second direction.

3. A combination as claimed in claim 2, wherein said heads are fitted to a common carriage sliding along said common crosspiece.

4. A combination as claimed in claim 3, wherein said carriage supports a tool store for said heads.

5. A combination as claimed in claim 1, wherein said two rows of heads are so arranged that the axes of the respective spindles are separated by a distance equal to that between said grooves in the two rows of fixtures.

6. A combination as claimed in claim 5, wherein said heads are fitted to a common carriage sliding along a common crosspiece; and wherein said fixtures are arranged in pairs in said first direction; the fixtures in each pair being aligned in said first direction; said heads being arranged in pairs on said common carriage; and the heads in each pair being aligned in said first direction.

7. A combination as claimed in claim 6, wherein said common crosspiece comprises at least a horizontal plate having two prismatic guides for guiding said carriage in said second direction.

8. A combination as claimed in claim 7, wherein said carriage comprises two box bars connected to each other by cross members; each of said box bars being reinforced by at least one prismatic bar parallel to said second direction; and each of said heads being fitted to said prismatic bar.

9. A combination as claimed in claim 3, wherein said crosspiece is carried by two uprights located close to a rear edge of the machine, so that said packs may be loaded and unloaded manually on and off said fixtures from the front side of the machine.

10. A combination as claimed in claim 9, wherein each of said pairs of heads is associated with a pair of tool-change devices and a common tool store; said store being fitted to said carriage and being accessible from said front side.

11. A combination as claimed in claim 10, wherein said store comprises at least one box removably insertable inside a corresponding support fixed on one side of each pair of said heads; said box containing a number of tools arranged in rows and columns.

12. A combination as claimed in claim 10, wherein the fixtures in each row are spaced to define gaps housing respective pairs of tool-change devices; a further pair of tool-change devices being located adjacent to the pair of fixtures at one end of said worktable.

13. A combination as claimed in claim 12, wherein two supports, each for housing a respective box, are provided on either side of each pair of heads; a further pair of tool-change devices being located adjacent to the pair of fixtures at the opposite end of said worktable; and the pairs of tool-change devices housed in said gaps being selectively associated with each of the two adjacent pairs of said heads.

14. A combination as claimed in claim 11, wherein each of said boxes comprises a supporting body supporting a number of separating elements defining a number of guides for a corresponding number of strips of tools; each one of said strips being provided with an asymmetric cavity adapted to be engaged by a means for ensuring insertion of said strip with a predetermined orientation.

15. A combination as claimed in claim 14, wherein said support comprises a pair of members fitted to said carriage; retaining means being provided between said supporting body and one of said members to secure said box to said member; and said retaining means comprising a manual release member.

* * * * *